(12) United States Patent
Elsherbini et al.

(10) Patent No.: US 11,881,457 B2
(45) Date of Patent: Jan. 23, 2024

(54) SEMICONDUCTOR PACKAGING WITH HIGH DENSITY INTERCONNECTS

(71) Applicant: Tahoe Research, Ltd., Dublin (IE)

(72) Inventors: Adel A. Elsherbini, Chandler, AZ (US); Johanna M. Swan, Scottsdale, AZ (US); Shawna M. Liff, Scottsdale, AZ (US); Henning Braunisch, Phoenix, AZ (US); Krishna Bharath, Chandler, AZ (US); Javier Soto Gonzalez, Chandler, AZ (US); Javier A. Falcon, Chandler, AZ (US)

(73) Assignee: Tahoe Research, Ltd., Dublin (IE)

( * ) Notice: Subject to any disclaimer, the term of this patent is extended or adjusted under 35 U.S.C. 154(b) by 162 days.

(21) Appl. No.: 17/192,462

(22) Filed: Mar. 4, 2021

(65) Prior Publication Data

US 2021/0193583 A1    Jun. 24, 2021

Related U.S. Application Data

(63) Continuation of application No. 16/335,845, filed as application No. PCT/US2016/054856 on Sep. 30, 2016, now Pat. No. 10,971,453.

(51) Int. Cl.
*H01L 23/538* (2006.01)
*H01L 25/065* (2023.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 25/0657; H01L 25/074; H01L 2924/15153
See application file for complete search history.

(56) References Cited

U.S. PATENT DOCUMENTS 5,519,176 A * 5/1996 Goodman ............ H05K 1/0253
174/250
2006/0226527 A1   10/2006 Hatano et al.
(Continued)

FOREIGN PATENT DOCUMENTS

KR   10-2014-0086416 A   7/2014
KR   10-2014-0095182 A   8/2014
(Continued)

OTHER PUBLICATIONS

U.S. Appl. No. 16/335,845, filed Mar. 22, 2019, Semiconductor Packaging With High Density Interconnects.
(Continued)

*Primary Examiner* — Robert G Bachner
*Assistant Examiner* — Molly K Reida
(74) *Attorney, Agent, or Firm* — Studebaker & Brackett PC

(57) ABSTRACT

Various embodiments disclosed relate to a semiconductor package. The present semiconductor package includes a substrate. The substrate is formed from alternating conducting layers and dielectric layers. A first active electronic component is disposed on an external surface of the substrate, and a second active electronic component is at least partially embedded within the substrate. A first interconnect region is formed from a plurality of interconnects between the first active electronic component and the second active electronic component. Between the first active electronic component and the substrate a second interconnect region is formed from a plurality of interconnects. Additionally, a third interconnect region is formed from a plurality of interconnects between the second active electronic component and the substrate.

19 Claims, 7 Drawing Sheets

(51) Int. Cl.
*H01L 23/498* (2006.01)
*H01L 25/18* (2023.01)
*H01L 21/48* (2006.01)
*H01L 23/00* (2006.01)
*H01L 25/00* (2006.01)
*H01L 25/03* (2006.01)

(52) U.S. Cl.
CPC .. *H01L 23/49827* (2013.01); *H01L 23/49833* (2013.01); *H01L 23/5383* (2013.01); *H01L 23/5386* (2013.01); *H01L 24/00* (2013.01); *H01L 24/17* (2013.01); *H01L 24/19* (2013.01); *H01L 24/20* (2013.01); *H01L 25/03* (2013.01); *H01L 25/0657* (2013.01); *H01L 25/50* (2013.01); *H01L 25/18* (2013.01); *H01L 2224/18* (2013.01); *H01L 2224/214* (2013.01); *H01L 2225/0651* (2013.01); *H01L 2225/0652* (2013.01); *H01L 2225/06513* (2013.01); *H01L 2225/06517* (2013.01); *H01L 2225/06562* (2013.01); *H01L 2225/06582* (2013.01); *H01L 2225/06589* (2013.01); *H01L 2924/15153* (2013.01)

(56) References Cited

U.S. PATENT DOCUMENTS

| | | | | |
|---|---|---|---|---|
| 2008/0111222 | A1* | 5/2008 | Sheridan | H01L 23/3107 257/E23.037 |
| 2009/0115050 | A1* | 5/2009 | Kasuya | H01L 23/3677 257/701 |
| 2010/0327424 | A1 | 12/2010 | Braunisch et al. | |
| 2012/0261838 | A1 | 10/2012 | Braunisch et al. | |
| 2013/0087920 | A1* | 4/2013 | Jeng | H01L 23/49827 257/773 |
| 2013/0098667 | A1 | 4/2013 | Ryu et al. | |
| 2013/0277865 | A1* | 10/2013 | Teh | H01L 23/12 257/782 |
| 2014/0042601 | A1* | 2/2014 | Hawk | H01L 25/0657 257/E21.705 |
| 2014/0293563 | A1 | 10/2014 | Loo et al. | |
| 2015/0179608 | A1 | 6/2015 | Sung et al. | |
| 2019/0259705 | A1 | 8/2019 | Elsherbini et al. | |

FOREIGN PATENT DOCUMENTS

| | | |
|---|---|---|
| WO | WO-2016036667 A1 | 3/2016 |
| WO | WO-2018063351 A1 | 4/2018 |

OTHER PUBLICATIONS

"U.S. Appl. No. 16/335,845, Non Final Office Action dated Sep. 2, 2020", 7 pgs.

"U.S. Appl. No. 16/335,845, Notice of Allowance dated Dec. 7, 2020", 7 pgs.

"U.S. Appl. No. 16/335,845, Response filed Nov. 24, 2020 to Non Final Office Action dated Sep. 2, 2020", 11 pgs.

"International Application Serial No. PCT/US2016/054856, International Search Report dated Jun. 27, 2017", 3 pgs.

"International Application Serial No. PCT/US2016/054856, Written Opinion dated Jun. 27, 2017", 9 pgs.

\* cited by examiner

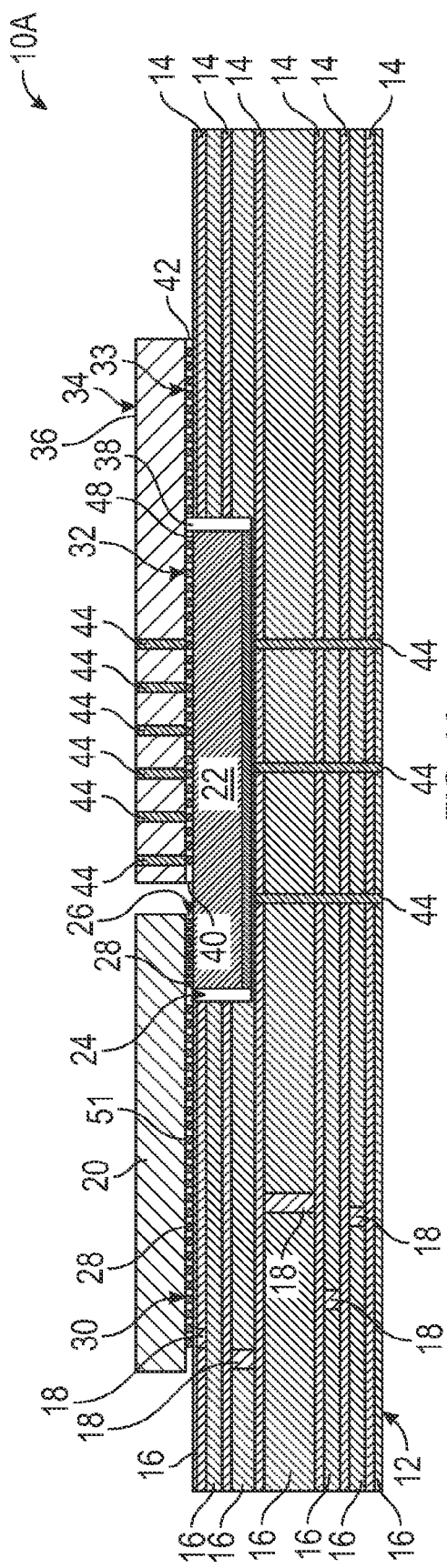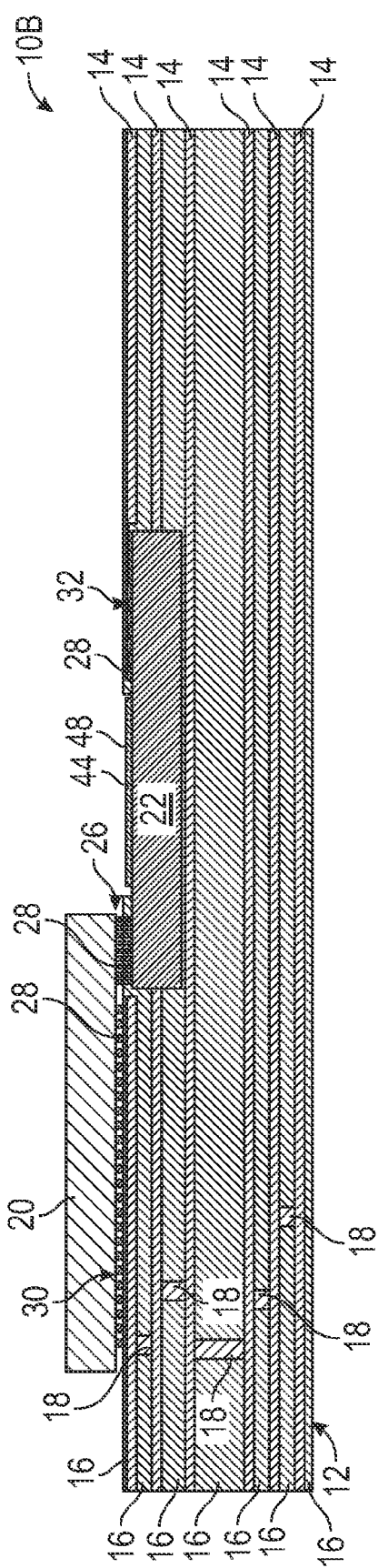

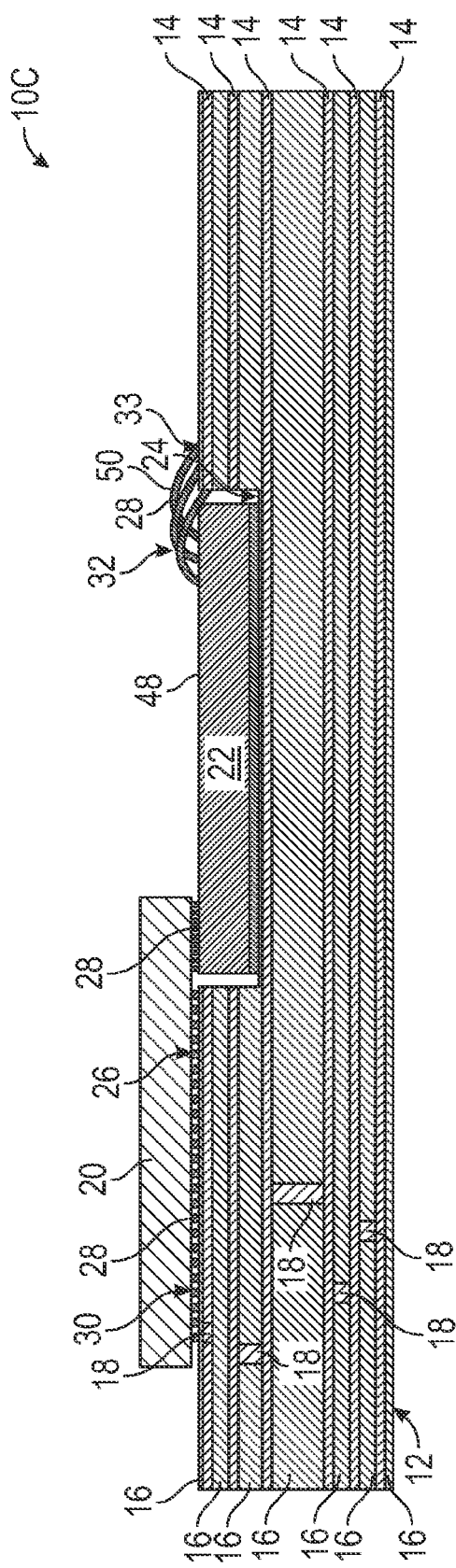
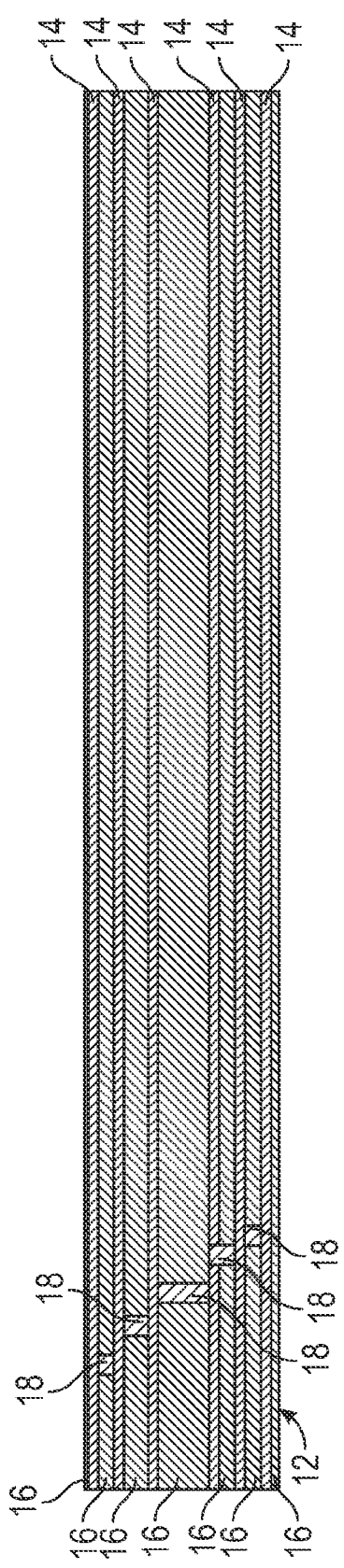
FIG. 1C
FIG. 2A

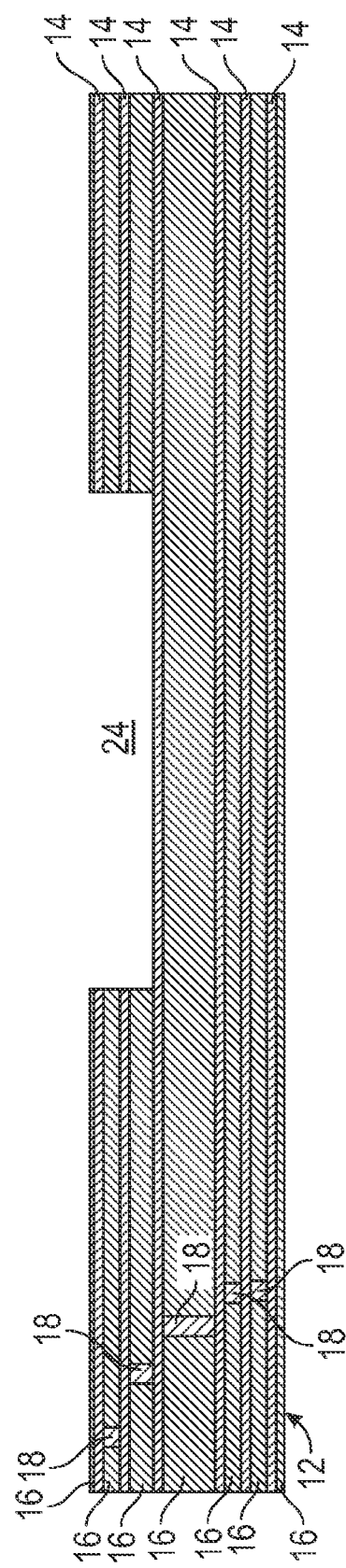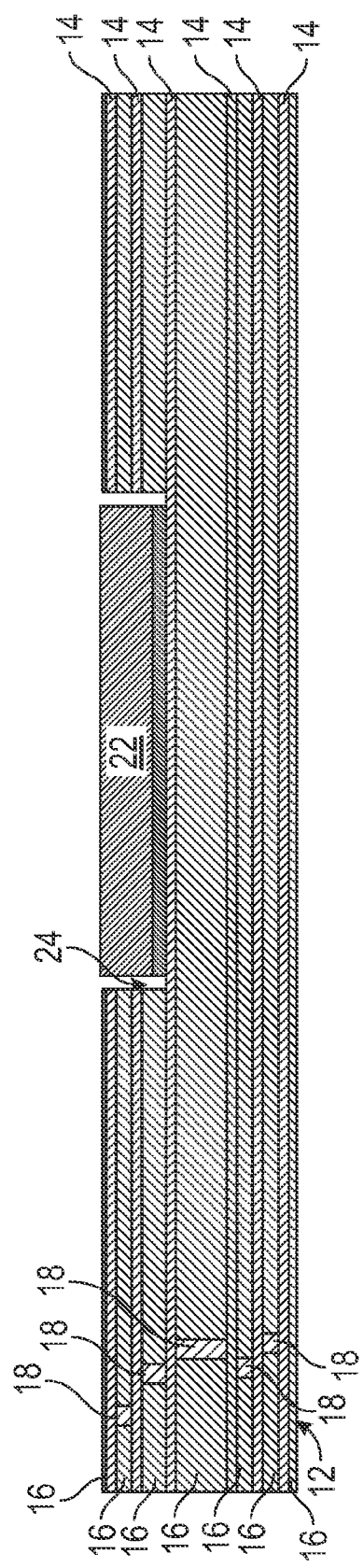

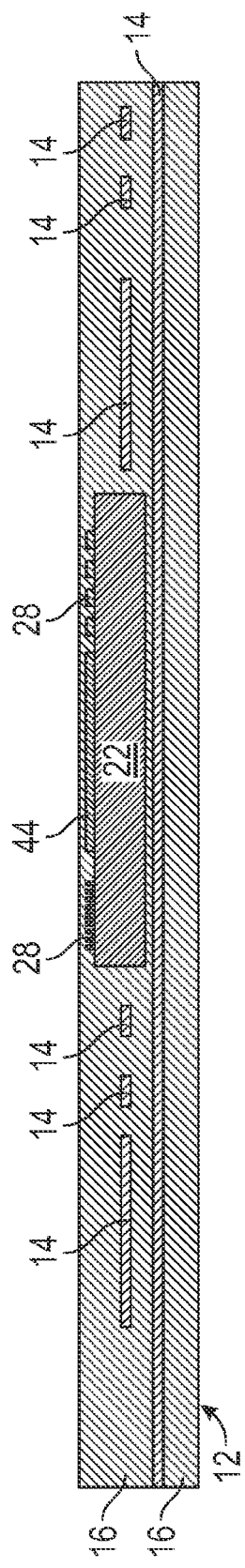
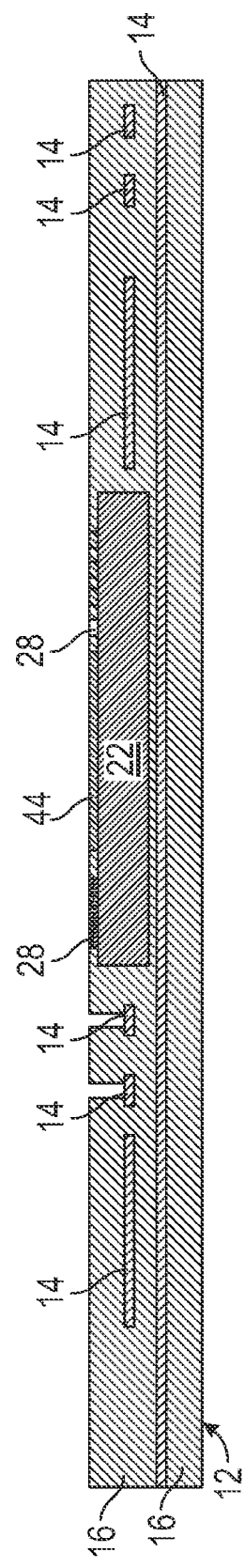
FIG. 3C
FIG. 3D

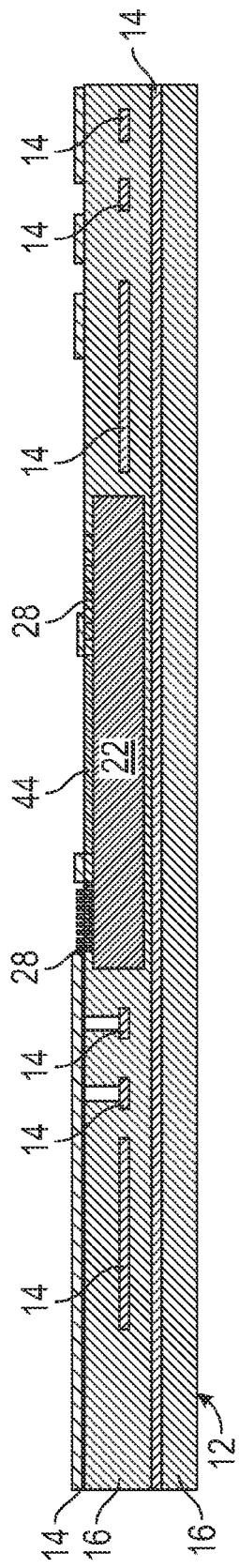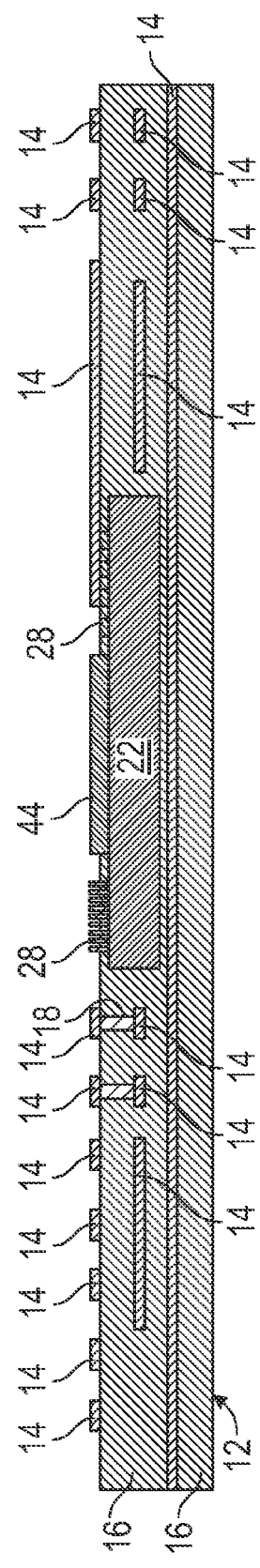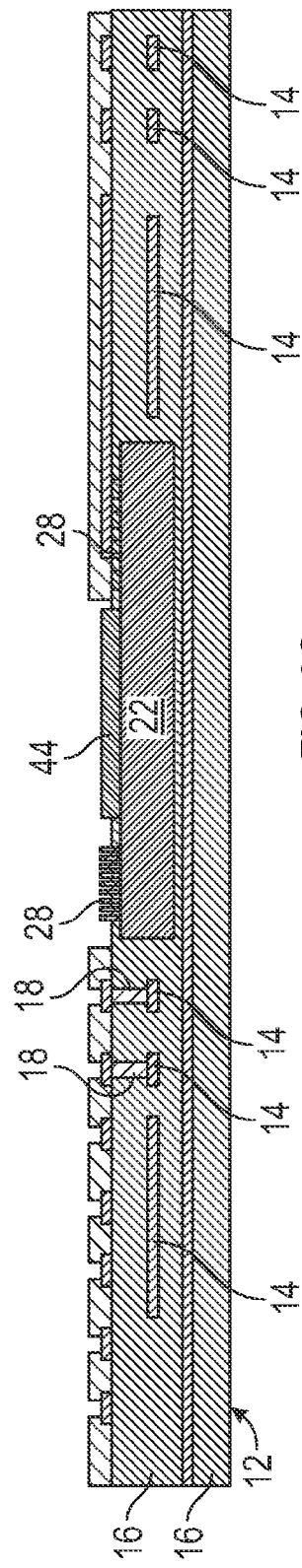

SEMICONDUCTOR PACKAGING WITH HIGH DENSITY INTERCONNECTS

This application is a continuation of U.S. patent application Ser. No. 16/335,845, filed Mar. 22, 2019, which is a U.S. National Stage Filing under 35 U.S.C. 371 from International Application No. PCT/US2016/054856, filed on Sep. 30, 2016, each of which is incorporated herein by reference in its entirety.

BACKGROUND

A challenge in semiconductor packaging is providing very high interconnect density between the different dies at relatively low cost. One possible solution is to use a silicon interposer between the different dies. Another option may be to use a very high-density organic interposer or packaging.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 1A is a schematic sectional view of a semiconductor package, in accordance with various embodiments.

FIG. 1B is a schematic sectional view of another semiconductor package, in accordance with various embodiments.

FIG. 1C is a schematic sectional view of yet another semiconductor package, in accordance with various embodiments.

FIGS. 2A-2E are schematic diagrams generally illustrating a method of forming a semiconductor package, in accordance with various embodiments.

FIGS. 3A-3G are schematic diagrams generally illustrating method of forming another semiconductor package, in accordance with various embodiments.

DETAILED DESCRIPTION

Figure 2D:
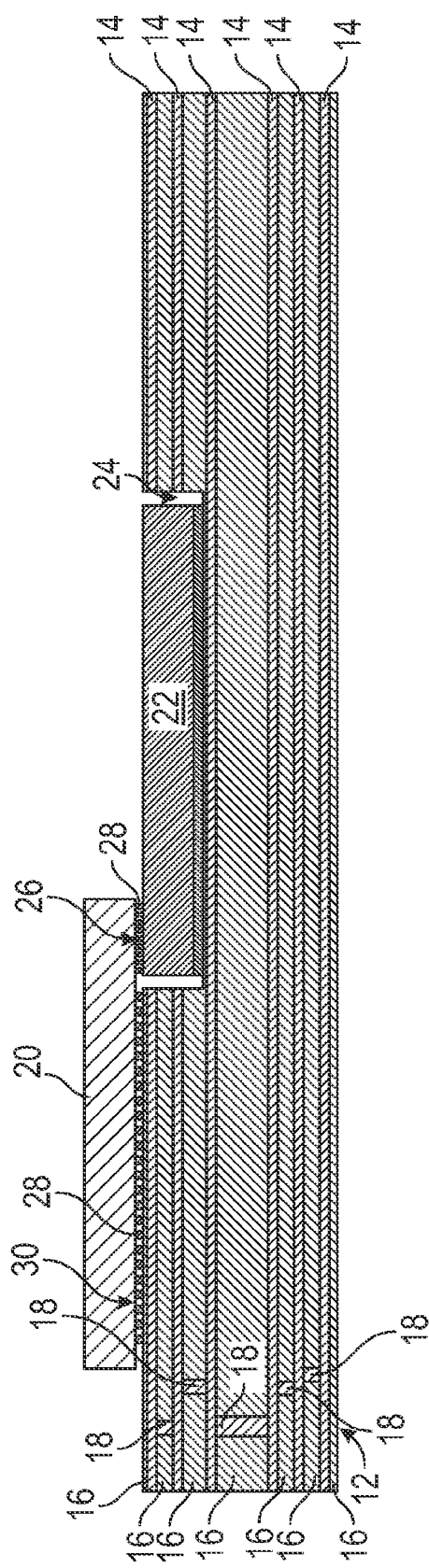

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the disclosure, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

FIG. 1A is a schematic sectional view of semiconductor package 10A. As shown in FIG. 1A, semiconductor package 10A includes substrate 12. Substrate 12 is formed from alternating conducting layers 14 and dielectric layers 16. Each of conducting layers 14 are formed from a conducting material such as copper. Conducting layers 14 allow a signal to be communicated and power to be delivered through substrate 12. Each conducting layer 14 is connected to others through substrate vias 18, which are typically formed from the same conductive material as each conducting layer 14. Each conducting layer 14 may have a different function. For example, some of conducting layers 14 may be adapted as signal layers, which transmit a signal through substrate 12. Other conducting layers 14 may be adapted as a power layer or a ground layer.

Dielectric layers 16 are interspersed with conducting layers 14 and are formed from a dielectric material. Suitable examples of dielectric materials include a buildup film a polyimide, a bismaleimide-triazine (BT) resin, an epoxy resin, a polyurethane, a benzocyclobutene (BCB), or a high-density polyethylene (HDPE). At least some of the dielectric materials may include reinforcing glass fibers. Substrate vias 18 are formed through dielectric layers 16 and connect conducting layers 14.

Semiconductor package 10A further includes at least two active electronic components. The active electronic components may be silicon dies. For example, first active electronic component 20 may be a first silicon die that may be a central processing unit, a field-programmable gate array, a system on chip, or a graphics processing unit. Second active electronic component 22 may be a second silicon die that may be a high-bandwidth memory, a package embedded memory, a flash memory, an embedded nonvolatile memory, a III-V die, an accelerator, or a low power double data rate memory. Both first active electronic component 20 and second active electronic component 22 have an active function beyond communicating a signal between components.

First active electronic component 20 is disposed on an external surface of substrate 12. The external surface may be a conducting layer or a dielectric layer with a substrate via 18 formed therebetween. Second active electronic component 22 is at least partially embedded within substrate 12. Specifically, second active electronic component 22 is embedded within recess 24 of substrate 12. Each of first active electronic component 20 and second active electronic component 22 has a number of interconnects disposed thereon. Specifically, first interconnect region 26 is formed from a plurality of interconnects 28 between first active electronic component 20 and second active electronic component 22.

Second interconnect region 30 is formed from a plurality of interconnects 28 between first active electronic component 20 and substrate 12. Additionally, third interconnect region 32 is formed from a plurality of interconnects 28 between second active electronic component 22 and substrate 12. Third interconnect region 32 may be formed in a number of different ways. As shown in FIG. 1A, for example, third interconnect region 32 is formed in part by interposer 34. Interposer 34 is formed from top surface 36 and bottom surface 38. Fourth interconnect region 33 includes a plurality of interconnects 28 and is defined between interposer 34 and substrate 12. First portion 40 of bottom surface 38 is connected to interconnects 28 of third interconnect region 32, and second portion 42 of bottom surface 38 is connected to interconnects 28 of fourth interconnect region 33. Interconnects 28 are formed from solder balls, which are connected to bottom surface 38 of interposer 34 and conducting layer 14 of substrate 12. As illustrated, first interconnect region 26 and third interconnect region 32 are located on the same surface of second active electronic component 22.

Interposer 34 is generally formed from a dielectric material similar to that of dielectric layers 16. A plurality of thermal vias 44 extends through the dielectric material from bottom surface 38 to top surface 36. Thermal vias 44 are formed from a thermally conducting material such as a metal. For example, thermal vias 44 may be formed from copper. Thermal vias 44 are positioned over second active electronic component 22. This allows heat generated during the operation of second active electronic component 22 to be efficiently taken away through thermal vias 44.

As shown in FIG. 1A, interconnects 28 of third interconnect region 32 are formed from solder balls. The solder balls are connected to bottom surface 38 of interposer 34 and to top surface 48 of second active electronic component 22. Additionally, interconnects 28 of first interconnect region 26 include solder balls, which are connected to bottom surface 51 of first active electronic component 20 and to top surface 48 of second active electronic component 22. Interconnects 28 of second interconnect region 30 include solder balls connected to conducting layer 14 of substrate 12 and to bottom surface 51 of first active electronic component 20.

The respective interconnect regions may differ from one another in terms of their function and the density of interconnects 28 therein. For example, first interconnect region 26 has a higher density of interconnects 28 than at least one of interconnects 28 of second interconnect region 30 and interconnects 28 of third interconnect region 32. This higher density may allow for the transfer of a high-bandwidth signal between first active electronic component 20 and second active electronic component 22. The lower density of second interconnect region 30 and third interconnect region 32, however, is sufficient for allowing power to be transferred from substrate 12 to first active electronic component 20 and second active electronic component 22, respectively.

The density of each interconnect region may be measured as a function of the pitch, or spacing between individual interconnects 28. For example, the pitch of interconnects 28 of first interconnect region 26 may have a value ranging from about 20 microns to about 80 microns, or about 40 microns to about 65 microns, or less than about, equal to about, or greater than about 25 microns, 30, 35, 40, 45, 50, 55, 60, 65, 70, or 75 microns. In examples where second interconnect region 30 is less dense than first interconnect region 26, the pitch of interconnects 28 of second interconnect region 30 may range from about 85 microns to about 350 microns or from about 100 microns to about 500 microns, or less than about, equal to about, or greater than about 110 microns, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, or 490 microns. Similarly, in examples where third interconnect region 32 is less dense than first interconnect region 26, the pitch of interconnects 28 of third interconnect region 32 may range from about 85 microns to about 500 microns or from about 100 microns to about 300 microns, or less than about, equal to about, or greater than about 120 microns, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, or 490 microns. The densities of second interconnect region 30 and third interconnect region 32 may be the same or different.

Each interconnect region accounts for a different percentage of a surface area of either first active electronic component 20 or second active electronic component 22. For example, first interconnect region 26 may range from about 2% to about 15% of a surface area of first active electronic component 20, or about 2% to about 10% of a surface area of first active electronic component 20, or less than about, equal to about, or greater than about 2%, 3, 4, 5, 6, 7, 8, 9, 10, 11, 12, 13, or 14% of a surface area of first active electronic component 20. The smaller the surface area is, the less distance a signal between first active electronic component 20 and second active electronic component 22 has to travel. As shown in FIG. 1A, second interconnect region 30 ranges from about 85% to about 95% of a surface area of first active electronic component 20, or from about 90% to about 98% of a surface area of first active electronic component 20, or less than about, equal to about, or greater than about 86%, 87, 88, 89, 90, 91, 92, 93, 94, 95, 96, or 97% of a surface area of first active electronic component 20. Similarly, third interconnect region 32 ranges from about 85% to about 95% of a surface area of second active electronic component 22, or from about 90% to about 98% of a surface area of second active electronic component 22, or less than about, equal to about, or greater than about 86%, 87, 88, 89, 90, 91, 92, 93, 94, 95, 96, or 97% of a surface area of second active electronic component 22.

FIG. 1B is a schematic sectional view showing semiconductor package 10B. FIG. 1B shows many of the same components as FIG. 1A. A difference between semiconductor package 10A and semiconductor package 10B, however, is that as shown in place of interposer 34, in semiconductor package 10B, third interconnect region 32 is formed from a portion of conducting layer 14 of substrate 12. That portion of substrate 12 forming third interconnect region 32 covers a portion of second active electronic component 22. Interconnects 28 of third interconnect region 32 include vias 18 from substrate 12 to second active electronic component 22.

Vias 18 of third interconnect region 32 are originally a part of second active electronic component 22, which are attached to substrate 12 by plating a layer of copper over vias 18. Second active electronic component 22 includes another set of vias 18 that connect with the solder balls of first active electronic component 20 to form first interconnect region 26.

Semiconductor package 10B further includes thermal via 44. Thermal via 44 is disposed on second active electronic component 22 between first interconnect region 26 and third interconnect region 32. The surface area of thermal via 44 may vary. For example, thermal via 44 may be disposed over a surface area of second active electronic component 22 ranging from about 25% to 50% of the surface area of second active electronic component 22, or ranging from about 25% to 35% of the surface area of second active electronic component 22, or less than about, equal to about, or greater than about 30%, 35, 40, or 45% of the surface area of second active electronic component 22. Thermal vias 44 may also exist in substrate 12 underneath second active electronic component 22

FIG. 1C is a schematic sectional diagram showing semiconductor package 10C. FIG. 1C shows many of the same components as FIGS. 1A and 1B. A difference between semiconductor package 10C and both semiconductor package 10A and semiconductor package 10B, however, is that in place of interposer 34, in semiconductor package 10C, third interconnect region 32 is formed from wire connections 50 between substrate 12 and second active electronic component 22.

FIGS. 2A-2E are schematic diagrams generally illustrating a method of forming semiconductor package 10A. FIG. 2A shows substrate 12 formed from alternating conducting layers 14 and dielectric layers 16. To assemble semiconductor package 10A, recess 24 is created in substrate 12. This is shown in FIG. 2B. Recess 24 may be created in many different ways, including milling, wet or dry etching, or mechanical milling. Additionally, recess 24 can be created by voiding an area in the top most copper and solder resist region. In other examples, substrate 12 may be formed to include recess 24 as a finished product. As shown in FIG. 2C, second active electronic component 22 is attached to recess 24. This may be accomplished using a die attach film (DAF). Attaching second active electronic component 22 using current manufacturing tools allows for placement accuracy of better than 6 μm. This in turn may allow for a pitch of interconnects 28 to be 55 μm or even smaller pitches such as 40 μm if needed. To account for package thickness variations, a softer DAF and slightly larger recess 24 may be used. First active electronic component 20 is then pressed down. Any air gap around first active electronic component 20 may be filled with an encapsulation material such as an epoxy. As shown in FIG. 2D, first active electronic component 20 is attached using thermocompression bonding (TCB). This allows for very fine alignment and collapse control as needed. In other examples, first active electronic component 20 and second active electronic component 22 may be attached face to face first, then attached to substrate 12 afterwards.

Figure 2E:
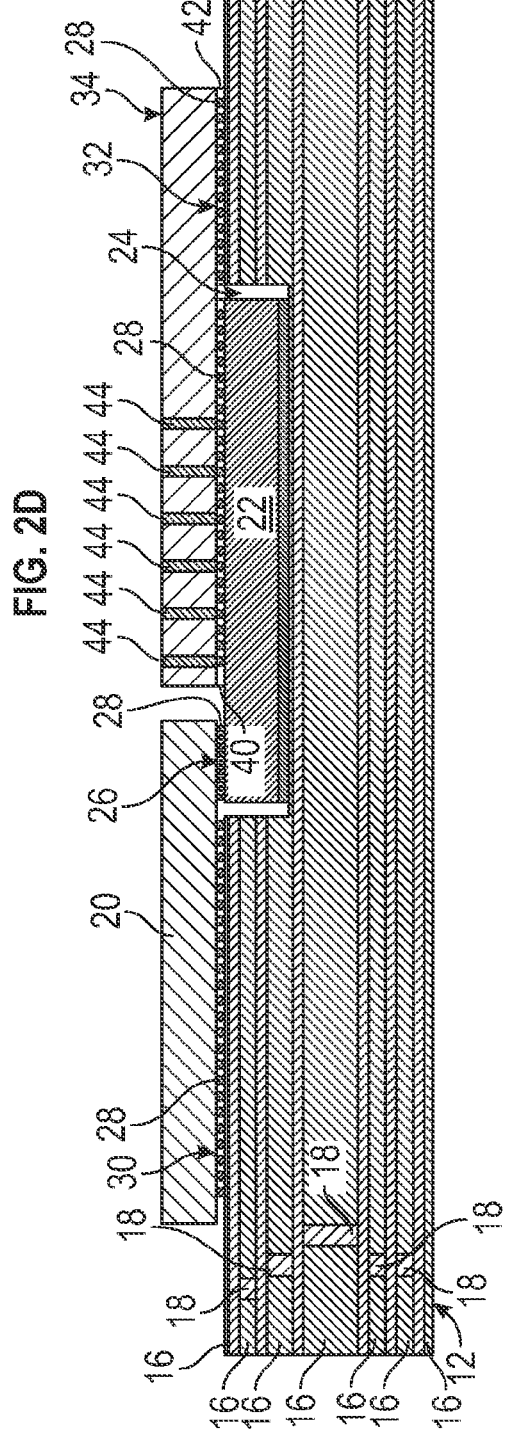

As shown in FIG. 2E, interposer 34 is attached to substrate 12 and second active electronic component 22. This may be done using thermally compression bonding techniques (TCB) or solder reflow. Interposer 34 may be manufactured using standard package manufacturing processes. Silicon has approximately 149 W/m·K thermal conductivity compared to about 400 W/m·K for copper. Depending on the amount of power that needs to be dissipated and the thickness of the interposer 34 package, via 18 density may be increased to reduce the thermal resistance. Alternatively, the thermal conductivity may be improved by using lithographic vias in interposer 34.

After interposer 34 is attached, a thermal interface material (TIM) may be applied to the top side of first active electronic component 20 and the topside of interposer 34. An integrated heat spreader (IHS) is then attached. In other examples, multiple types of TIM may be applied to account for height tolerances substrate 12 components. Furthermore, an integrated circuit and/or discrete components such as a voltage regulator, capacitors, or inductors may be placed on top of the top-side package as needed and comprehended by a suitable design of the IHS.

Figure 3A:
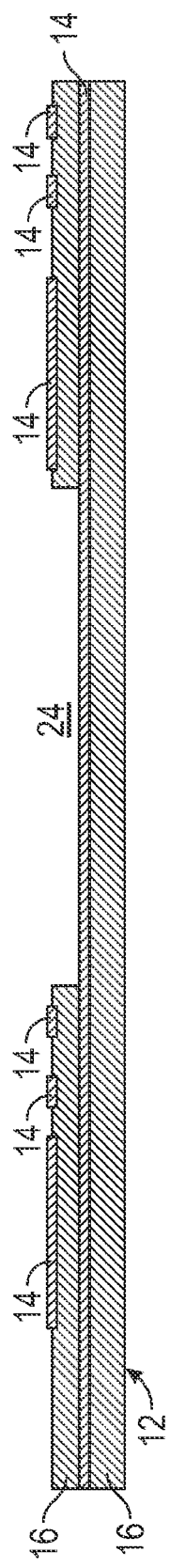
Figure 3B:
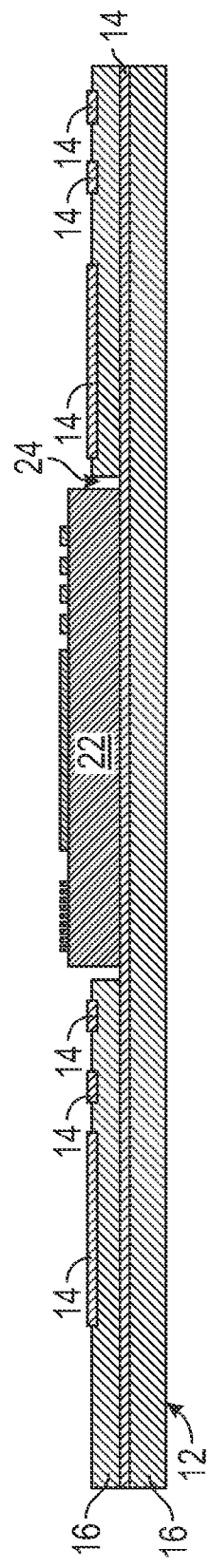

FIGS. 3A-3G are schematic diagrams generally illustrating a method of forming semiconductor package 10B. As shown in FIG. 3A, recess 24 is created in substrate 12. As shown in FIG. 3B, second active electronic component 22 is then embedded in recess 24. Second active electronic component 22 includes several vias 28 formed thereon. Each of the vias 28 may be relatively tall. For example, vias 28 may range from about 10 μm tall to about 20 μm tall. As shown in FIG. 3C, dielectric build up film is laminated over second active electronic component 22. As shown in FIG. 3D, substrate 12 is ground (e.g., using mechanical grinding or polishing) to reveal vias 28 on second active electronic component 22. As shown in FIG. 3E, a seed layer is then deposited on substrate 12 and second active electronic component 22, and a photo resist layer is applied, exposed, and developed. This creates an opening over vias 28, which may also be created using laser drilling if the exposure is not controllable. As shown in FIG. 3F, a metal conducting layer is then plated over substrate 12 and second active electronic component 22, and the photo resist is stripped. As shown in FIG. 3G, a solder mask is applied to substrate 12 and second active electronic component 22. The solder mask is then subsequently exposed and developed. First active electronic component 20 is then attached in a manner similar to that described with respect to FIG. 2C. Additionally, a thermal interface material may be applied to the top side of first active electronic component 20 and the top side of second active electronic component 22. An IHS is then attached. In other examples, multiple types of TIM may be applied to account for height tolerances between the MCP components. Furthermore, an integrated circuit and/or discrete components such as a voltage regulator, capacitors, or inductors may be placed on top of the top-side package as needed and comprehended by a suitable design of the IHS.

Although examples of this disclosure have been described in which only first active electronic component 20 and second active electronic component 22 are used, other examples of semiconductor package 10 may include additional active electronic components. For example, two or more active electronic components may be located in recess 24. Additionally, two or more active electronic components may be attached to second active electronic component 22.

There are many reasons to use semiconductor package 10A-10C, including the following non-limiting reasons. For example, semiconductor package 10 may provide up to 60% power saving compared to conventional packages due to the significantly reduced capacitance between first active electronic component 20 and second active electronic component 22. The reduced capacitance results from the decreased distance between the components as a function of the direct connection therebetween. Additionally, in some examples, the proposed semiconductor package 10 may allow interconnects 28 to operate at much higher bandwidth at the same power as current interconnects due to the drastically reduced resistance and the reduced capacitance. Additionally, in some embodiments, because the interconnect is extremely short (e.g., 50-100 μm), extremely high data rates/frequencies at very fine pitches are possible (e.g., for a millimeter-wave interconnect to a III-V die for generation/amplification) with very low loss compared to many current approaches.

Additional Embodiments

The following exemplary embodiments are provided, the numbering of which is not to be construed as designating levels of importance:

Embodiment 1 provides a semiconductor package comprising:
a substrate comprising:
alternating conducting layers and dielectric layers;
a first silicon die disposed on an external surface of the substrate;
a second active electronic component at least partially embedded within the substrate;
a first interconnect region formed from a plurality of interconnects between the first active electronic component and the second active electronic component;
a second interconnect region formed from a plurality of interconnects between the first active electronic component and the substrate; and
a third interconnect region formed from a plurality of interconnects between the second active electronic component and the substrate.

Embodiment 2 provides the semiconductor package of Embodiment 1, wherein the conducting layers comprise:
a conducting material.

Embodiment 3 provides the semiconductor package of any one of Embodiments 1-2, wherein the conducting material is copper.

Embodiment 4 provides the semiconductor package of any one of Embodiments 1-3, wherein the dielectric layers comprise:
a dielectric material.

Embodiment 5 provides the semiconductor package of any one of Embodiments 1-4, wherein the dielectric material is selected from the group consisting of a polyimide, a bismaleimide-triazine (BT) resin, an epoxy resin, a polyurethane, a benzocyclobutene (BCB), a high-density polyethylene (HDPE), a woven glass fiber reinforced resin, or combinations thereof.

Embodiment 6 provides the semiconductor package of any one of Embodiments 1-5, wherein the first interconnect region has a higher density of interconnects than at least one of the second interconnect region and the third interconnect region.

Embodiment 7 provides the semiconductor package of any one of Embodiments 1-6, wherein the interconnects of the first interconnect region comprise:
solder balls connected to a bottom surface of the first active electronic component and a top surface of the second active electronic component.

Embodiment 8 provides the semiconductor package of any one of Embodiments 1-7, wherein the interconnects of the first interconnect region comprise:
solder balls connected to the bottom surface of the first active electronic component; and
vias connected to the top surface of the second active electronic component,
wherein the solder balls and the vias are connected to each other.

Embodiment 9 provides the semiconductor package of any one of Embodiments 1-8, wherein the interconnects of the second interconnect region comprise:
solder balls connected to a conducting layer of the substrate and the first active electronic component.

Embodiment 10 provides the semiconductor package of any one of Embodiments 1-9, wherein the interconnects of the first interconnect region have a pitch ranging from about 20 microns to about 80 microns.

Embodiment 11 provides the semiconductor package of any one of Embodiments 1-10, wherein the interconnects of the first interconnect region have a pitch ranging from about 40 microns to about 65 microns.

Embodiment 12 provides the semiconductor package of any one of Embodiments 1-11, wherein the interconnects of the second interconnect region have a pitch ranging from about microns μm to about 500 microns.

Embodiment 13 provides the semiconductor package of any one of Embodiments 1-12, wherein the interconnects of the second interconnect region have a pitch ranging from about 100 microns to about 300 microns.

Embodiment 14 provides the semiconductor package of any one of Embodiments 1-13, wherein the interconnects of the third interconnect region have a pitch ranging from about microns μm to about 500 microns.

Embodiment 15 provides the semiconductor package of any one of Embodiments 1-14, wherein the interconnects of the third interconnect region have a pitch ranging from about 100 microns to about 300 microns.

Embodiment 16 provides the semiconductor package of any one of Embodiments 1-15, wherein a density of the second interconnect region and a density of the third interconnect region are the same.

Embodiment 17 provides the semiconductor package of any one of Embodiments 1-16, wherein a density of the second interconnect region and a density of the third interconnect region are different.

Embodiment 18 provides the semiconductor package of any one of Embodiments 1-17, wherein the first interconnect region comprises about 2% to about 15% of a surface area of the first active electronic component.

Embodiment 19 provides the semiconductor package of any one of Embodiments 1-18, wherein the first interconnect region comprises about 2% to about 10% of a surface area of the first active electronic component.

Embodiment 20 provides the semiconductor package of any one of Embodiments 1-19, wherein the first interconnect region comprises about 2% to about 15% of a surface area of the second active electronic component.

Embodiment 21 provides the semiconductor package of any one of Embodiments 1-20, wherein the first interconnect region comprises about 2% to about 10% of a surface area of the second active electronic component.

Embodiment 22 provides the semiconductor package of any one of Embodiments 1-21, wherein the second interconnect region comprises about 85% to about 95% of a surface area of the first active electronic component.

Embodiment 23 provides the semiconductor package of any one of Embodiments 1-22, wherein the second interconnect region comprises about 90% to about 98% of a surface area of the first active electronic component.

Embodiment 24 provides the semiconductor package of any one of Embodiments 1-23, wherein the third interconnect region comprises about 85% to about 95% of a surface area of the second active electronic component.

Embodiment 25 provides the semiconductor package of any one of Embodiments 1-24, wherein the third interconnect region comprises about 90% to about 98% of a surface area of the second active electronic component.

Embodiment 26 provides the semiconductor package of any one of Embodiments 1-25, wherein the third interconnect region is formed from an interposer comprising:
  a top surface;
  a bottom surface; and
  a fourth interconnect region between the interposer and the substrate,
    wherein a first portion of the bottom surface is connected to the interconnects of the third interconnect region; and a second portion of the bottom surface is connected to interconnects of a fourth interconnect region.

Embodiment 27 provides the semiconductor package of any one of Embodiments 1-26, wherein the interposer further comprises:
  a plurality of thermal vias extending from the bottom surface of the interposer to the top surface of the interposer.

Embodiment 28 provides the semiconductor package of any one of Embodiments 1-27, wherein the interconnects of the third interconnect region comprise:
  solder balls connected to the bottom surface of the interposer and the top surface of the second active electronic component.

Embodiment 29 provides the semiconductor package of any one of Embodiments 1-28, wherein the fourth interconnect region comprises a plurality of interconnects.

Embodiment 30 provides the semiconductor package of any one of Embodiments 1-29, wherein the interconnects of the fourth interconnect region comprise:
  solder balls connected to the bottom surface of the interposer and a conducting layer of the substrate.

Embodiment 31 provides the semiconductor package of any one of Embodiments 1-30, wherein the thermal vias are positioned over the second active electronic component.

Embodiment 32 provides the semiconductor package of any one of Embodiments 1-31, wherein the thermal vias are formed from a thermally conductive material.

Embodiment 33 provides the semiconductor package of any one of Embodiments 1-32, wherein the thermally conductive material is copper.

Embodiment 34 provides the semiconductor package of any one of Embodiments 1-33, wherein the third interconnect region is formed from a portion of a conducting layer of the substrate.

Embodiment 35 provides the semiconductor package of any one of Embodiments 1-34, wherein the third interconnect region covers a portion of the second active electronic component.

Embodiment 36 provides the semiconductor package of any one of Embodiments 1-35, and further comprising:
  a thermal via disposed on the second active electronic component and between the first interconnect region and the third interconnect region.

Embodiment 37 provides the semiconductor package of any one of Embodiments 1-36, wherein the thermal via is disposed over a surface area of the second active electronic component ranging from about 25% to 50% of the surface area of the second active electronic component.

Embodiment 38 provides the semiconductor package of any one of Embodiments 1-37, wherein the thermal via is disposed over a surface area of the second active electronic component ranging from about 25% to 35% of the surface area of the second active electronic component.

Embodiment 39 provides the semiconductor package of any one of Embodiments 1-38, wherein the first interconnect region and the third interconnect region are located on a same surface of the second active electronic component.

Embodiment 40 provides the semiconductor package of any one of Embodiments 1-39, wherein the third interconnect region is formed from wires between the substrate and the second active electronic component.

Embodiment 41 provides the semiconductor package of any one of Embodiments 1-40, wherein the first active electronic component is a first silicon die.

Embodiment 42 provides the semiconductor package of any one of Embodiments 1-41, wherein the first silicon die is selected from the group consisting of a central processing unit, a field-programmable gate array, a system on chip, or a graphics processing unit or a combination thereof.

Embodiment 43 provides the semiconductor package of any one of Embodiments 1-42, wherein the second active electronic component is a second silicon die.

Embodiment 44 provides the semiconductor package of any one of Embodiments 1-43, wherein the second silicon die is selected from the group consisting of a high-bandwidth memory, a package embedded memory, a flash memory, an embedded nonvolatile memory, a III-V die, an accelerator, and a low power double data rate memory.

Embodiment 45 provides a semiconductor package comprising:
  a substrate comprising:
    alternating conducting layers and dielectric layers;
  a first active electronic component disposed on an external surface of the substrate;
  a second active electronic component at least partially embedded within the substrate;
  a first interconnect region formed from a plurality of interconnects between the first active electronic component and the second active electronic component;
  a second interconnect region formed from a plurality of interconnects between the first active electronic component and the substrate; and
  a third interconnect region formed from a plurality of interconnects between the second active electronic component and the substrate,
    wherein a density of the interconnects of the first interconnect region is greater than a density of the interconnects of at least one of the second interconnect region and the third interconnect region.

Embodiment 46 provides the semiconductor package of Embodiment 45, wherein the conducting layers comprise:
  a conducting material.

Embodiment 47 provides the semiconductor package of any one of Embodiments 45-46, wherein the conducting material is copper.

Embodiment 48 provides the semiconductor package of any one of Embodiments 45-47, wherein the dielectric layers comprise:
  a dielectric material.

Embodiment 49 provides the semiconductor package of any one of Embodiments 45-48, wherein the interconnects of the first interconnect region comprise:
  solder balls connected to a bottom surface of the first active electronic component and a top surface of the second active electronic component.

Embodiment 50 provides the semiconductor package of any one of Embodiments 45-49, wherein the interconnects of the first interconnect region comprise:
  solder balls connected to the bottom surface of the first active electronic component; and vias connected to the top surface of the second active electronic component, wherein the solder balls and the vias are connected to each other.

Embodiment 51 provides the semiconductor package of any one of Embodiments 45-50, wherein the interconnects of the second interconnect region comprise:

solder balls connected to a conducting layer of the substrate and the first active electronic component.

Embodiment 52 provides the semiconductor package of any one of Embodiments 45-51, wherein the interconnects of the first interconnect region have a pitch ranging from about 20 microns to about 80 microns.

Embodiment 53 provides the semiconductor package of any one of Embodiments 45-52, wherein the interconnects of the first interconnect region have a pitch ranging from about 40 microns to about 65 microns.

Embodiment 54 provides the semiconductor package of any one of Embodiments 45-53, wherein the interconnects of the second interconnect region have a pitch ranging from about 85 microns to about 500 microns.

Embodiment 55 provides the semiconductor package of any one of Embodiments 45-54, wherein the interconnects of the second interconnect region have a pitch ranging from about 100 microns to about 300 microns.

Embodiment 56 provides the semiconductor package of any one of Embodiments 45-55, wherein the interconnects of the third interconnect region have a pitch ranging from about 85 microns to about 500 microns.

Embodiment 57 provides the semiconductor package of any one of Embodiments 45-56, wherein the interconnects of the third interconnect region have a pitch ranging from about 100 microns to about 300 microns.

Embodiment 58 provides the semiconductor package of any one of Embodiments 45-57, wherein the density of the interconnects of the second interconnect region and the density of the interconnects of the third interconnect region are the same.

Embodiment 59 provides the semiconductor package of any one of Embodiments 45-58, wherein the density of the interconnects of the second interconnect region and the density of the interconnects of the third interconnect region are different.

Embodiment 60 provides the semiconductor package of any one of Embodiments 45-59, wherein the first interconnect region comprises about 2% to about 15% of a surface area of the first active electronic component.

Embodiment 61 provides the semiconductor package of any one of Embodiments 45-60, wherein the first interconnect region comprises about 2% to about 10% of a surface area of the first active electronic component.

Embodiment 62 provides the semiconductor package of any one of Embodiments 45-61, wherein the first interconnect region comprises about 2% to about 15% of a surface area of the second active electronic component.

Embodiment 63 provides the semiconductor package of any one of Embodiments 45-62, wherein the first interconnect region comprises about 2% to about 10% of a surface area of the second active electronic component.

Embodiment 64 provides the semiconductor package of any one of Embodiments 45-63, wherein the second interconnect region comprises about 85% to about 95% of a surface area of the first active electronic component.

Embodiment 65 provides the semiconductor package of any one of Embodiments 45-64, wherein the second interconnect region comprises about 90% to about 98% of a surface area of the first active electronic component.

Embodiment 66 provides the semiconductor package of any one of Embodiments 45-65, wherein the third interconnect region comprises about 85% to about 95% of a surface area of the second active electronic component.

Embodiment 67 provides the semiconductor package of any one of Embodiments 45-66, wherein the third interconnect region comprises about 90% to about 98% of a surface area of the second active electronic component.

Embodiment 68 provides the semiconductor package of any one of Embodiments 45-67, wherein the third interconnect region is formed from an interposer comprising:

a top surface;

a bottom surface; and a fourth interconnect region between the interposer and the substrate, wherein a first portion of the bottom surface is connected to the interconnects of the third interconnect region; and a second portion of the bottom surface is connected to interconnects of a fourth interconnect region.

Embodiment 69 provides the semiconductor package of any one of Embodiments 45-68, wherein the interposer further comprises:

a plurality of thermal vias extending from the bottom surface of the interposer to the top surface of the interposer.

Embodiment 70 provides the semiconductor package of any one of Embodiments 45-69, wherein the interconnects of the third interconnect region comprise:

solder balls connected to the bottom surface of the interposer and the top surface of the second active electronic component.

Embodiment 71 provides the semiconductor package of any one of Embodiments 45-70, wherein the fourth interconnect region comprises a plurality of interconnects.

Embodiment 72 provides the semiconductor package of any one of Embodiments 45-71, wherein the interconnects of the fourth interconnect region comprise:

solder balls connected to the bottom surface of the interposer and a conducting layer of the substrate.

Embodiment 73 provides the semiconductor package of any one of Embodiments 45-72, wherein the thermal vias are positioned over the second active electronic component.

Embodiment 74 provides the semiconductor package of any one of Embodiments 45-73, wherein the thermal vias are formed from a thermally conductive material.

Embodiment 75 provides the semiconductor package of any one of Embodiments 45-74, wherein the thermally conductive material is copper.

Embodiment 76 provides the semiconductor package of any one of Embodiments 45-75, wherein the third interconnect region is formed from a portion of a conducting layer of the substrate.

Embodiment 77 provides the semiconductor package of any one of Embodiments 45-76, wherein the third interconnect region covers a portion of the second active electronic component.

Embodiment 78 provides the semiconductor package of any one of Embodiments 45-77, and further comprising:

a thermal via disposed on the second active electronic component and between the first interconnect region and the third interconnect region.

Embodiment 79 provides the semiconductor package of any one of Embodiments 45-78, wherein the thermal via is disposed over a surface area of the second active electronic component ranging from about 25% to 50% of the surface area of the second active electronic component.

Embodiment 80 provides the semiconductor package of any one of Embodiments 45-79, wherein the thermal via is disposed over a surface area of the second active electronic component ranging from about 25% to 35% of the surface area of the second active electronic component.

Embodiment 81 provides the semiconductor package of any one of Embodiments 45-80, wherein the first interconnect region and the third interconnect region are located on a same surface of the second active electronic component.

Embodiment 82 provides the semiconductor package of any one of Embodiments 45-81, wherein the third interconnect region is formed from wires between the substrate and the second active electronic component.

Embodiment 83 provides the semiconductor package of any one of Embodiments 45-82, wherein the first active electronic component is a first silicon die.

Embodiment 84 provides the semiconductor package of any one of Embodiments 45-83, wherein the first silicon die is selected from the group consisting of a central processing unit, a field-programmable gate array, a system on chip, or a graphics processing unit or a combination thereof.

Embodiment 85 provides the semiconductor package of any one of Embodiments 45-84, wherein the second active electronic component is a second silicon die.

Embodiment 86 provides the semiconductor package of any one of Embodiments 45-85, wherein the second silicon die component is selected from the group consisting of a high-bandwidth memory, a package embedded memory, a flash memory, an embedded nonvolatile memory, a III-V die, an accelerator, and a low power double data rate memory.

Embodiment 87 provides the semiconductor package of any one of Embodiments 45-86, wherein the dielectric material is selected from the group consisting of a buildup film, a polyimide, a bismaleimide-triazine (BT) resin, an epoxy resin, a polyurethane, a benzocyclobutene (BCB), a high-density polyethylene (HDPE), or combinations thereof.

Embodiment 88 provides a method of forming a semiconductor package comprising:
  placing a first active electronic component on a substrate;
  placing a second active electronic component in a recess of the substrate;
  forming a first interconnection between the first active electronic component and the second active electronic component;
  forming a second interconnection between the first active electronic component and the substrate; and
  forming a third interconnection between the second active electronic component and the substrate.

Embodiment 89 provides the method of Embodiment 88, and further comprising:
  forming the recess in the substrate.

Embodiment 90 provides the method of any one of Embodiments 88-89, wherein the recess is formed in the substrate by laser milling, wet etching, dry etching, or mechanical milling.

Embodiment 91 provides the method of any one of Embodiments 88-90, and further comprising:
  dispensing a die attach film to the second active electronic component; and
  contacting the die attach film to the recess of the substrate.

Embodiment 92 provides the method of any one of Embodiments 88-91, wherein forming the first interconnection comprises:
  aligning a first set of solder balls of the first active electronic component with a second set of solder balls of the second active electronic component;
  contacting the first set of solder balls and the second set of solder balls; heating the first set of solder balls and the second set of solder balls; and cooling the first set of solder balls and the second set of solder balls.

Embodiment 93 provides the method of any one of Embodiments 88-92, wherein forming the second interconnection comprises:
  aligning a third set of solder balls of the first active electronic component with a conducting layer of the substrate;
  contacting the third set of solder balls with the conducting layer;
  heating the third set of solder balls and the conducting layer; and
  cooling the third set of solder balls and the conducting layer.

Embodiment 94 provides the method of any one of Embodiments 88-93, wherein forming the third interconnection comprises:
  attaching an interposer to the second active electronic component.

Embodiment 95 provides the method of any one of Embodiments 88-94, wherein attaching the interposer to the second active electronic component comprises:
  aligning a fourth set of solder balls of the interposer with the second active electronic component;
  heating the fourth set of solder balls; and
  cooling the fourth set of solder balls.

Embodiment 96 provides the method of any one of Embodiments 88-95, wherein the second active electronic component comprises:
  a first plurality of vias;
  a second plurality of vias; and
  a thermal via.

Embodiment 97 provides the method of any one of Embodiments 88-96, wherein the first plurality of vias have a higher density than the second plurality of vias.

Embodiment 98 provides the method of any one of Embodiments 88-97, wherein the first plurality of vias have a pitch ranging from about 20 microns to about 80 microns.

Embodiment 99 provides the method of any one of Embodiments 88-98, wherein the first plurality of vias have a pitch ranging from about 40 microns to about 65 microns.

Embodiment 100 provides the method of any one of Embodiments 88-99, wherein the second plurality of vias have a pitch ranging from about 85 microns to about 350 microns.

Embodiment 101 provides the method of any one of Embodiments 88-100, wherein the second plurality of vias have a pitch ranging from about 100 microns to about 350 microns.

Embodiment 102 provides the method of any one of Embodiments 88-101, and further comprising:
  coating the second active electronic component in a dielectric material.

Embodiment 103 provides the method of any one of Embodiments 88-102, and further comprising:
  etching the dielectric material coating the second active electronic component to expose the first plurality of vias, the second plurality of vias, and the thermal via.

Embodiment 104 provides the method of any one of Embodiments 88-103, and further comprising:
  plating a layer of conducting material over the second plurality of vias and the substrate.

Embodiment 105 provides the method of any one of Embodiments 88-104, wherein forming the third interconnection between the second active electronic component and the substrate comprises:

connecting a set of interconnects of the second active electronic component to a conducting layer of the substrate with a wire.

Embodiment 106 provides the method of any one of Embodiments 88-105, wherein the first active electronic component is a first silicon die.

Embodiment 107 provides the method of any one of Embodiments 88-106, wherein the first silicon die is selected from the group consisting of a central processing unit, a field-programmable gate array, or a combination thereof.

Embodiment 108 provides the method of any one of Embodiments 88-107, wherein the second active electronic component is a second silicon die.

Embodiment 109 provides the method of any one of Embodiments 88-108, wherein the second silicon die electronic component is selected from the group consisting of a high-bandwidth memory, a package embedded memory, a flash memory, an embedded nonvolatile memory, a graphics card, a III-V die, an accelerator, and a low power double data rate memory.

What is claimed is:

1. A semiconductor package comprising:
    a substrate comprising:
    alternating conducting layers and dielectric layers;
    a first active electronic component disposed on an external surface of the substrate;
    a second active electronic component at least partially embedded within the substrate;
    a first interconnect region formed from a plurality of interconnects between the first active electronic component and the second electronic component;
    a second interconnect region formed from a plurality of interconnects between the first active electronic component and the substrate; and
    a third interconnect region formed from a plurality of interconnects between the second active electronic component and the substrate, the third interconnect region including an interposer which is distinct from the first active electronic component and spaced from the first active electronic component such that a gap, which extends an entire height of the interposer, exists between the interposer and the first active electronic component.

2. The semiconductor package of claim 1, wherein the dielectric layers comprise a dielectric material is selected from the group consisting of, a polyimide, a bismaleimide-triazine (BT) resin, an epoxy resin, a polyurethane, a benzocyclobutene (BCB), a high-density polyethylene (HDPE), or combinations thereof.

3. The semiconductor package of claim 1, wherein the interconnects of the first region comprise:
    solder balls connected to a bottom surface of the first active electronic component; and
    vias connected to a top surface of the second active electronic component,
    wherein the solder balls and vias are connected to each other.

4. The semiconductor package of claim 1, wherein the first interconnect region comprises about 2% to about 15% of a surface area of the first active electronic component.

5. The semiconductor package of claim 1, wherein the second interconnect region comprises about 85% to about 95% of a surface area of the first active electronic component.

6. The semiconductor package of claim 1, wherein the interposer comprises:
    a top surface;
    a bottom surface;
    a fourth interconnect region between the interposer and the substrate,
    wherein a first portion of the bottom surface is connected to the interconnects of the third interconnect region; and a second portion of the bottom surface is connected to the interconnects of the fourth interconnect region.

7. The semiconductor package of claim 6, wherein the interposer further comprises:
    a plurality of thermal vias extending from the bottom surface of the interposer to the top surface of the interposer.

8. The semiconductor package of claim 7, wherein the thermal vias are positioned over the second active electronic component.

9. The semiconductor package of claim 7, wherein the thermal via is disposed over a surface area of the second active electronic component ranging from about 25% to 50% of the surface area of the second active electronic component.

10. The semiconductor package of claim 7, wherein the thermal via is disposed over a surface area of the second active electronic component ranging from about 25% to 35% of the surface area of the second active electronic component.

11. The semiconductor package of claim 1, wherein the first active electronic component is a first silicon die.

12. The semiconductor package of claim 1, wherein the second active electronic component is a second silicon die.

13. The semiconductor package of claim 1, wherein the interconnects of the first region have a pitch ranging from about 20 microns to about 80 microns.

14. The semiconductor package of claim 1, wherein the interconnects of the first region have a pitch ranging from about 40 microns to about 65 microns.

15. The semiconductor package of claim 1, wherein the interconnects of the second region have a pitch ranging from about 85 microns to about 350 microns.

16. The semiconductor package of claim 1, wherein the interconnects of the second region have a pitch ranging from about 100 microns to about 300 microns.

17. The semiconductor package of claim 1, wherein the interconnects of the third region have a pitch ranging from about 85 microns to about 350 microns.

18. The semiconductor package of claim 1, wherein the interconnects of the third region have a pitch ranging from about 100 microns to about 300 microns.

19. A semiconductor package comprising:
    a substrate comprising:
    alternating conducting layers and dielectric layers;
    a first active electronic component disposed on an external surface of the substrate;
    a second active electronic component at least partially embedded within the substrate;
    a first interconnect region formed from a plurality of interconnects between the first active electronic component and the second electronic component;
    a second interconnect region formed from a plurality of interconnects between the first active electronic component and the substrate; and a third interconnect region formed from a plurality of interconnects between the second active electronic component and the substrate, the third interconnect region including an interposer which is distinct from the first active electronic component and spaced from the first active electronic component such that a gap, which extends an entire height of the interposer, exists between the interposer and the first active electronic component, wherein the interconnects of the first region have a pitch ranging from about 20 microns to about 80 microns;

the interconnects of the second region have a pitch ranging from about 85 microns to about 350 microns; and the interconnects of the third region have a pitch ranging from about 85 microns to about 350 microns.

\* \* \* \* \*